(12) United States Patent
Mapoles et al.

(10) Patent No.: US 7,106,434 B1
(45) Date of Patent: Sep. 12, 2006

(54) INSPECTION TOOL

(75) Inventors: Evan R. Mapoles, San Ramon, CA (US); Ralph Wolf, Palo Alto, CA (US)

(73) Assignee: KLA-Tencor Technologies, Inc., Milpitas, CA (US)

( * ) Notice: Subject to any disclaimer, the term of this patent is extended or adjusted under 35 U.S.C. 154(b) by 582 days.

(21) Appl. No.: 10/628,626

(22) Filed: Jul. 28, 2003

(51) Int. Cl.
*G01B 11/24* (2006.01)
(52) U.S. Cl. .................................... 356/237.5
(58) Field of Classification Search .............. None
See application file for complete search history.

(56) References Cited

U.S. PATENT DOCUMENTS

| | | | | |
|---|---|---|---|---|
| 6,038,029 A | * | 3/2000 | Finarov | 356/399 |
| 6,208,751 B1 | | 3/2001 | Almogy | 382/149 |
| 6,674,510 B1 | * | 1/2004 | Jasper et al. | 355/55 |

FOREIGN PATENT DOCUMENTS

| | | |
|---|---|---|
| WO | WO 01/80289 | 10/2001 |
| WO | WO 02/25708 | 3/2002 |
| WO | WO 02/29385 | 4/2002 |
| WO | WO 02/088677 | 11/2002 |

* cited by examiner

*Primary Examiner*—Tu T. Nguyen
(74) *Attorney, Agent, or Firm*—Luedeka, Neely & Graham, P.C.

(57) ABSTRACT

An integrated inspection system adapted to inspect a substrate. A first inspection station performs a first inspection of the substrate at a first resolution, and identifies defect candidate sites. A controller determines position information associated with each of the identified defect candidate sites. A second inspection station performs a second inspection of the defect candidate sites at a second resolution, where the second resolution is higher than the first resolution. A substrate stage moves the substrate between the first inspection station and the second inspection station, and indexes the substrate under both the first inspection station and the second inspection station.

20 Claims, 1 Drawing Sheet

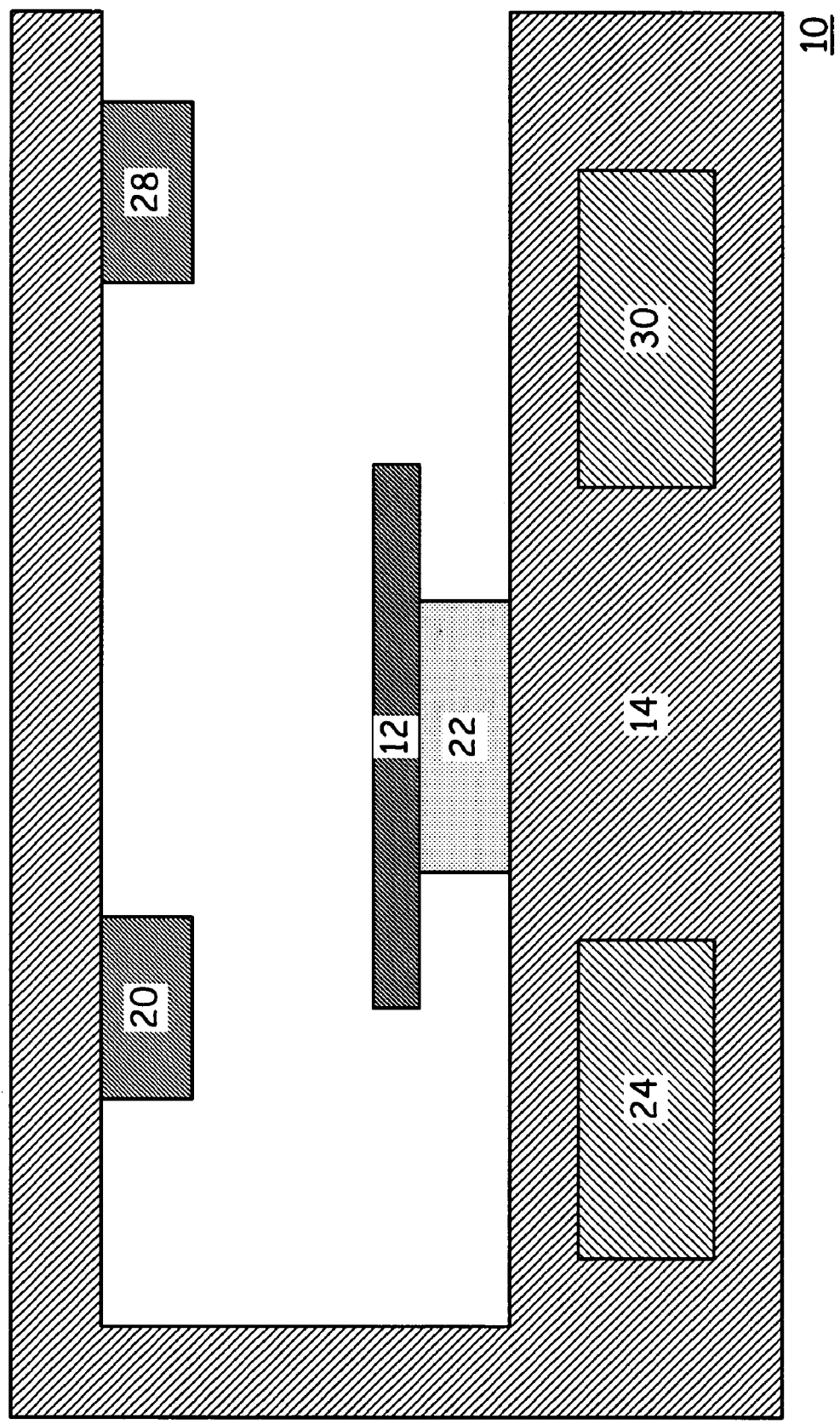

INSPECTION TOOL

FIELD

This invention relates to the field of inspection instrumentation. More particularly, this invention relates to increasing the speed at which defects on a sample are reviewed and classified, and at which inspection parameters on an inspection tool are optimized to find specific defects of interest.

BACKGROUND

The integrated circuit industry relies on the continual and repeated inspection of integrated circuits as they are produced to ensure that processes are operating properly and that the integrated circuits themselves are properly formed. Automated inspection is normally the preferred method of inspection of integrated circuits. However, as integrated circuits evolve, they are becoming smaller and more complicated. Thus, there has been continual pressure to detect and classify a growing number of defects and other conditions that may be present on the substrate, but which are increasingly more difficult to see. In addition, fabrication units are producing more and more integrated circuits so as to reduce the overhead costs associated with production, and to satisfy the demands of the modern world. Such demands have resulted in a desire to reduce the time associated with integrated circuit inspection Current inspection methods in integrated circuit manufacturing typically use two completely separate inspection tools. The first inspection tool typically inspects all of the substrate surface to identify candidate defect sites. These first inspection tools typically use optical techniques and are limited in resolution by the wavelengths of the light that they use. These first inspection tools identify many candidate defect sites, whose defect size is typically below the resolution of the optical first inspection tool used. Thus, a second higher resolution, but much slower, inspection tool is then typically used to inspect and provide high resolution images of each of the candidate defect sites. These high resolution images are then typically used to classify the defects that may or may not be found at the candidate defect sites.

The second inspection tool is typically an electron microscope. Thus, in a typical process, the integrated circuit substrate is first inspected using the first inspection tool, and then the substrate is removed from the first inspection tool and placed in the second inspection tool to further investigate the candidate defect sites, and to determine which defects identified by the first tool are those that may impact device yield. The coordinate system of the first tool must be re-acquired by the second tool, costing additional time. This may be followed by a re-inspection with the first tool with modified inspection parameters to improve its capture of these more important defects. Repeatedly transferring the substrate from the first inspection tool to the second inspection tool is time consuming, and therefore costly.

Typically, only a subset of the candidate defect sites have actual defects that negatively affect process yield. Thus, the slower second inspection tool is often bogged down by inspecting candidate defect sites that have no bearing on device yield.

What is needed, therefore, is a system for reducing the amount of handling and time needed to identify and classify those defects that impact device yield on a substrate.

SUMMARY

The above and other needs are met by an integrated inspection system, containing two or more inspection stations, adapted to inspect a substrate. A first inspection station performs a first inspection of the substrate at a first resolution, and identifies defect candidate sites. A controller determines position information associated with each of the identified defect candidate sites. A second inspection station performs a second inspection of the defect candidate sites at a second resolution, where the second resolution is higher than the first resolution. A calibrated substrate stage moves the substrate between the first inspection station and the second inspection station, and indexes the substrate between the known locations of the first inspection station and the second inspection station.

In this manner, additional handling is not required and time is not wasted in unloading the substrate from one inspection tool, transporting it to another tool, and reloading, aligning, and registering the substrate to the coordinate system of the second inspection tool. Because the integrated inspection system as described above utilizes a common substrate stage, the single stage can move the substrate between the lower resolution station and the higher resolution station. Further, the controller tracks position information for each of the candidate defect sites, thus enabling the common substrate stage to position the candidate defect sites directly under the higher resolution second inspection station. Thus, time is not spent re-acquiring the coordinate system of the first tool when the substrate is transferred to the second tool.

In various preferred embodiments, the first inspection station is an optical inspection station. The second inspection station is preferably one of a scanning probe microscope, such as an atomic force microscope, a near field scanning optical microscope, and a magnetic force microscope, or a scanning tunneling microscope. Preferably, the distance between the first and second inspection stations is fixed and known. This is preferably accomplished by mechanically referencing the critical components of each inspection station to a common aluminum casting or granite slab.

Also described is a method for inspecting a substrate. The substrate is positioned at a first inspection station using a substrate stage. A surface of the substrate is imaged at a first resolution using the first inspection station, and defect candidate sites on the surface of the substrate are identified. The substrate is positioned at a second inspection station using the substrate stage, and the defect candidate sites are imaged using the second inspection station.

In various preferred embodiments, the steps are performed under the control of a controller connected to the first inspection station, the second inspection station, and the substrate stage. Preferably, the first inspection station is an optical inspection station. The second inspection station is preferably a scanning probe microscope, such as one of an atomic force microscope, a near field scanning optical microscope, and a magnetic force microscope. Preferably, the distance between the first and second inspection stations is fixed and known. This is preferably accomplished by mechanically referencing the critical components of each inspection station to a common aluminum casting or granite slab.

According to yet another aspect of the invention there is described a method for optimizing inspection parameters of an integrated inspection system. A substrate is positioned at a first inspection station using a substrate stage, and a surface of the substrate is imaged at a first resolution using the first inspection station. Defect candidate sites on the surface of the substrate are identified based on the inspection parameters. The substrate is positioned at a second inspection station using the substrate stage, and the defect candidate sites are imaged at a second resolution using the second inspection station, where the second resolution is greater than the first resolution. The defect candidate sites imaged with the second inspection station are reviewed to determine which of the defect candidate sites are actual defect sites. The inspection parameters are altered based on the determination of which of the defect candidate sites are actual defect sites.

In various preferred embodiments, the steps are performed automatically with a controller connected to the first inspection station, the second inspection station, and the substrate stage. Preferably, the first inspection station is an optical inspection station. The second inspection station is preferably a scanning probe microscope, such as one of an atomic force microscope, a near field scanning optical microscope, and a magnetic force microscope.

BRIEF DESCRIPTION OF THE DRAWINGS

Further advantages of the invention are apparent by reference to the detailed description when considered in conjunction with the FIGURE, which is not to scale so as to more clearly show the details, wherein like reference numbers indicate like elements and wherein is depicted a functional block diagram of an integrated system for inspecting substrates according to a preferred embodiment of the invention.

DETAILED DESCRIPTION

With reference now to the FIGURE, there is depicted a functional block diagram of the integrated inspection system 10 according to a preferred embodiment of the invention. The integrated inspection system 10 preferably includes two inspection stations, being a first inspection station 20 and a second inspection station 28. The integrated inspection system 10 integrates the first inspection station 20 with the second inspection station 28 in a way that enhances the degree of communication between the inspection station 20 and the second inspection station 28, as described in more detail below.

The inspection tool 20 is preferably an optical inspection station of the type such as may be used for integrated circuit substrate inspection. As an example, but in no way limiting, the inspection station 20 may be a charge coupled device line sensor or a time-delay integration sensor, or a photomultiplier based integrating detector fitted with optics as are desirable for the use of such in an automated inspection system.

The second inspection station 28 is preferably a scanning probe microscope such as at least one of an atomic force microscope, a near field scanning optical microscope, and a magnetic force microscope, or a scanning tunneling microscope. The type of second inspection station 28 that is selected may depend at least in part on the application to which the integrated inspection system 10 will be applied. For example, in applications where layers have topology, an atomic force microscope may be appropriate, and a near field optical scanning probe might be used on planarized layers. The second inspection station 28 is preferably mechanically referenced to the same physical platform 14 as the first inspection tool 20, as depicted in the figure. For example, the distance between the first and second inspection stations is preferably fixed and known. This is most preferably accomplished such as by mechanically referencing the critical components of each inspection station to a common aluminum casting or granite slab.

A controller 30 preferably controls the actions and imaging parameters of the integrated inspection system 10, including the first inspection station 20, the second inspection station 28, and a common substrate stage 22. The substrate 12 is preferably moved between the first inspection station 20 and the second inspection station 28 using the substrate stage 22. Additionally, the substrate stage 22 preferably indexes the substrate 12 under each of the first inspection station 20 and the second inspection station 28 during the inspection processes. The operation of the integrated inspection system 10 is preferably configurable through an interface 24.

The interface 24 preferably includes a modern computer, running a general purpose operating system such as Windows or Unix, and custom electronics and software for controlling the instrument and managing the various types of associated data. This data includes calibration information about the instrument, information about the substrate being inspected—such as die size and layout, preferred instrument configuration, and defect classification rules—as well as the results of any given inspection from any of the inspection stations.

The integrated system 10 preferably functions in the following manner. The substrate 12 is loaded onto the substrate stage 22, preferably such as from a substrate cassette by an automated substrate handling device. The substrate stage 22 positions the substrate 12 at the inspection station 20. The substrate stage 22 preferably has the capability to move in all of the X, Y, Z, and theta (rotational) directions, and in some embodiments is also capable of tilt. The substrate stage 22 is under the control of the controller 30, which both directs the movement of the substrate stage 22, and keeps track of the position and orientation of the substrate stage 22 at all times. For example, as data is received from one of the two inspection stations 20 or 28, the controller 30 is aware of the physical location on the substrate 12 from which that data is originating and is capable of quickly and automatically positioning the same physical location under the other inspection station.

After the substrate 12 is positioned under the first inspection station 20, the controller 30 initiates an inspection of the substrate 12 by the first inspection station 20. As a part of this process, the substrate 12 is preferably systematically scanned by the first inspection station 20 as the substrate stage 22 is indexed underneath the first inspection station 20 by the substrate stage 22. In one embodiment, the substrate stage 22 moves the substrate 12 to specific locations underneath the first inspection station 20, so that only specific portions of the substrate 12 are inspected by the first inspection station 20. However, in the preferred embodiments, the substrate stage 22 systematically moves the entire substrate 12 underneath the first inspection station 20, so that the entire surface of the substrate 12 is inspected by the first inspection station 20.

The selection of which type of inspection to perform on the substrate 12, as described above, is preferably entered through the interface 24 and stored by the computer as a substrate-specific operational routine or recipe. Whenever a given type of substrate is loaded into the instrument, the associated recipe is retrieved by the computer and used to program the controller 30. As the substrate 12 is scanned under the first inspection station 20, the first inspection station 20 sends information to the controller 30 that indicates whether any of the physical features on the surface of the substrate 12 appear to be malformed. Such possible malformations are referred to herein as defect candidate sites. Upon receipt of such information, the controller 30 determines the position of the substrate stage 22, and associates the position information with the defect candidate site that has been identified. Preferably, the entire surface of the substrate 12 is relatively quickly optically scanned by the first inspection station 20, and all of the defect candidate sites and their associated position information is recorded by the controller 30.

The substrate stage 22, under the control of the controller 30, then positions the substrate 12 under the second inspection station 28. Preferably, only the defect candidate sites are imaged by the second inspection station 28, which obtains high resolution images of the candidate defect sites on the surface of the substrate 12, but which might take a longer period of time to make such high resolution images. Such a system as described, where the first and second inspection station 20 and 28 are disposed on the same platform 14, a common substrate stage 22 carries the substrate 12 between the first and second inspection station 20 and 28, and a common controller 30 controls the positioning of the substrate 12 under the second inspection station 28 at only the candidate defect sites, decreases the time used and the possibility of human error in using an inspection system.

After the defect candidate sites are imaged by the second inspection station 28, the resulting images are preferably reviewed by either a human operator or an automatic defect classification system to determine which of the defect candidate sites actually contained defects that have an effect on yield. Such information is preferably reported, such as through the interface 24, so that appropriate action can be taken in regard to the defects. The data obtained by the second inspection station 28 preferably provides the information to be used in the classification and root cause analysis of the actual defect. If the data is adequate for understanding and classification of the defect, then there is no need to further inspect the substrate 12, such as with an electron microscope. Reducing the use of an additional inspection instrument, such as an external scanning electron microscope, further increases the speed of integrated circuit substrate defect detection provided by the system as described herein.

In one embodiment, the inspection parameters of the integrated inspection system 10 are preferably adjusted within the controller 30 to optimize the detection of defect candidate sites that actually contain defects which have an effect on yield, and decrease the detection of defect candidate sites that do not contain such defects. This process can be repeated until the optimal detection of defect candidate sites containing yield effecting defects has been obtained. This optimization process of the invention is particularly advantageous over traditional inspection processes, since it can dramatically reduce the number of candidate defect sites that are imaged by the higher resolution, but slower, second inspection station 28. In some circumstances, such as when this optimization process is completed and the fabrication process is capable and under control, the review and classification of detected defects can be discontinued and Statistical Process Control techniques can be used to validate the inspection results, based only on the number and type of candidate defects found by the first inspection station.

Preferably, the distance between the first and second inspection stations is fixed and known. This is most preferably accomplished by mechanically referencing the critical components of each inspection station to a common aluminum casting or granite slab. In an alternate embodiment, the integrated inspection system 10 includes a plurality of second inspection stations 28. This allows the best second inspection method to be used, depending upon the characteristics of the surface of the substrate 12 on which the candidate defect site is located.

The foregoing description of preferred embodiments for this invention has been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An integrated inspection system adapted to inspect a substrate, the integrated inspection system comprising:
    a first inspection station adapted to perform a first inspection of the substrate at a first resolution and for identifying defect candidate sites, the first inspection station disposed at a first known location,
    a controller adapted to determine and track position information associated with each of the identified defect candidate sites,
    a second inspection station adapted to perform a second inspection of the defect candidate sites at a second resolution, where the second resolution is higher than the first resolution, the second inspection station disposed at a second known location, and
    a substrate stage adapted to move the substrate between the first known location of the first inspection station and the second known location of the second inspection station, and to move the substrate under both the first inspection station and the second inspection station,
    where the controller positions the substrate stage at the identified defect candidate sites under the second inspection station using known coordinates of the first known location, the second known location, and the position information associated with each of the identified defect candidate sites, and without re-acquiring a coordinate system of the first inspection station when the substrate is transferred to the second inspection station.

2. The integrated inspection system of claim 1, wherein the first inspection station is an optical inspection station.

3. The integrated inspection system of claim 1, wherein the second inspection station is a scanning probe microscope.

4. The integrated inspection system of claim 1, wherein the second inspection station is an atomic force microscope.

5. The integrated inspection system of claim 1, wherein the second inspection station is a near field scanning optical microscope.

6. The integrated inspection system of claim 1, wherein the second inspection station is a magnetic force microscope.

7. The integrated inspection system of claim 1, wherein the second inspection station is a scanning tunneling microscope.

8. The integrated inspection system of claim 1, wherein a distance between the first inspection station and the second inspection station is fixed and known by mechanically referencing critical components of the first inspection station and the second inspection to a common structure.

9. A method for inspecting a substrate, the method comprising the steps of:
   a) positioning the substrate at a first inspection station using a substrate stage,
   b) imaging a surface of the substrate at a first resolution using the first inspection station,
   c) identifying defect candidate sites on the surface of the substrate,
   d) determining and tracking position information associated with each of the identified defect candidate sites,
   e) positioning the substrate at a second inspection station using the substrate stage, and
   f) imaging the defect candidate sites using the second inspection station, where the substrate is positioned at the identified defect candidate sites under the second inspection station using known coordinates of the first inspection station and the second inspection station, and the position information associated with each of the identified defect candidate sites, and without re-acquiring a coordinate system of the first inspection station when the substrate is positioned at the second inspection station.

10. The method of claim 9, wherein steps a–e are performed under the control of a controller connected to the first inspection station, the second inspection station, and the substrate stage.

11. The method of claim 9, wherein the second inspection station is a scanning probe microscope.

12. The method of claim 9, wherein the second inspection station is an atomic force microscope.

13. The method of claim 9, wherein the second inspection station is a near field scanning optical microscope.

14. The method of claim 9, wherein the second inspection station is a magnetic force microscope.

15. The method of claim 9, wherein a distance between the first inspection station and the second inspection station is fixed and known by mechanically referencing critical components of the first inspection station and the second inspection to a common structure.

16. A method for optimizing inspection parameters of an integrated inspection system, the method comprising the steps of:
   a) positioning a substrate at a first inspection station using a substrate stage,
   b) imaging a surface of the substrate at a first resolution using the first inspection station,
   c) identifying defect candidate sites on the surface of the substrate based on the inspection parameters,
   d) determining and tracking position information associated with each of the identified defect candidate sites,
   e) positioning the substrate at a second inspection station using the substrate stage,
   f) imaging the defect candidate sites at a second resolution using the second inspection station, where the second resolution is greater than the first resolution, where the substrate is positioned at the identified defect candidate sites under the second inspection station using known coordinates of the first inspection station and the second inspection station, and the position information associated with each of the identified defect candidate sites, and without re-acquiring a coordinate system of the first inspection station when the substrate is positioned at the second inspection station,
   g) reviewing the defect candidate sites imaged with the second inspection station to determine which of the defect candidate sites are actual defect sites, and
   h) altering the inspection parameters based on the determination of which of the defect candidate sites are actual defect sites.

17. The method of claim 16, wherein steps a–g are performed automatically with a controller connected to the first inspection station, the second inspection station, and the substrate stage.

18. The method of claim 16, wherein the second inspection station is an atomic force microscope.

19. The method of claim 16, wherein the second inspection station is a near field scanning optical microscope.

20. The method of claim 16, wherein the second inspection station is a magnetic force microscope.

* * * * *